US012727512B2

(12) United States Patent
Jang et al.

(10) Patent No.: US 12,727,512 B2
(45) Date of Patent: Sep. 1, 2026

(54) SEMICONDUCTOR PACKAGE

(71) Applicant: Samsung Electronics Co., Ltd., Suwon-si (KR)

(72) Inventors: Doyoung Jang, Suwon-si (KR); Eunsu Lee, Suwon-si (KR); Daeyoung Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 390 days.

(21) Appl. No.: 18/354,928

(22) Filed: Jul. 19, 2023

(65) Prior Publication Data

US 2024/0203942 A1 Jun. 20, 2024

(30) Foreign Application Priority Data

Dec. 19, 2022 (KR) ........................ 10-2022-0178378

(51) Int. Cl.
*H10W 90/00* (2026.01)
*H10W 20/20* (2026.01)

(52) U.S. Cl.
CPC ........... *H10W 90/00* (2026.01); *H10W 20/20* (2026.01); *H10W 90/724* (2026.01); *H10W 90/754* (2026.01)

(58) Field of Classification Search
CPC ... H01L 25/0655; H01L 23/481; H01L 24/16; H01L 24/48; H01L 25/105; H01L 2224/16227; H01L 2224/48229; H01L 2924/1431; H01L 2924/1434; H01L 2225/06506; H01L 2225/0651; H01L 2225/06562; H01L 25/0657; H01L 25/18; H01L 2225/1058
See application file for complete search history.

(56) References Cited

U.S. PATENT DOCUMENTS

| | | | |
|---|---|---|---|
| 6,971,577 B2 | 12/2005 | Tsikos et al. | |
| 8,927,333 B2 | 1/2015 | Lin et al. | |
| 9,589,945 B2 | 3/2017 | Jo et al. | |
| 10,679,930 B2 | 6/2020 | Lee et al. | |
| 2008/0150096 A1 | 6/2008 | Ishio | |
| 2019/0259742 A1* | 8/2019 | Han | H01L 24/49 |
| 2022/0013474 A1 | 1/2022 | Yoo et al. | |
| 2022/0068739 A1 | 3/2022 | Son et al. | |

FOREIGN PATENT DOCUMENTS

| | | |
|---|---|---|
| KR | 10-2015-0014568 A | 2/2015 |
| KR | 10-2015-0019901 A | 2/2015 |
| KR | 10-2021-0075270 A | 6/2021 |

* cited by examiner

*Primary Examiner* — Elias Ullah

(74) *Attorney, Agent, or Firm* — Wolf, Greenfield & Sacks, P.C.

(57) ABSTRACT

A semiconductor package includes a first substrate, a first semiconductor chip on the first substrate, and second semiconductor chips on the first substrate and adjacent sides of the first semiconductor chip, each of the second semiconductor chips has an elongated shape extending along one of the sides of the first semiconductor chip which is adjacent thereto, and a width of each of the second semiconductor chips is smaller than a width of the first semiconductor chip.

20 Claims, 11 Drawing Sheets

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2022-0178378, filed on Dec. 19, 2022, in the Korean Intellectual Property Office, the entire contents of which are hereby incorporated by reference.

BACKGROUND OF THE INVENTION

The inventive concept relates to a semiconductor package, and more particularly, to a semiconductor package including a plurality of semiconductor chips.

An integrated circuit chip is provided with a semiconductor package so as to be suitably applied to an electronic product. In a general semiconductor package, an integrated circuit chip is mounted on a printed circuit board (PCB) and is electrically connected to the PCB through bonding wirings or bumps. Various technologies for improving reliability, integration, and miniaturization of the semiconductor package have been developed within the electronic industry.

SUMMARY

The inventive concept may provide a semiconductor package with improved structural stability.

The inventive concept may provide a semiconductor package with improved thermal stability.

The problem to be solved by the inventive concept is not limited to the problems mentioned above, and other problems not mentioned will be clearly understood by those skilled in the art from the following description.

A semiconductor package according to some embodiments of the inventive concept may include a first substrate, a first semiconductor chip on the first substrate, and second semiconductor chips on the first substrate and adjacent sides of the first semiconductor chip on the first substrate, each of the second semiconductor chips may have an elongated shape extending along one of the sides of the first semiconductor chip which is adjacent thereto, and a width of each of the second semiconductor chips may be smaller than a width of the first semiconductor chip.

A semiconductor package according to some embodiments of the inventive concept may include a first substrate including substrate pads on an upper surface thereof, a first semiconductor chip flip-chip bonded to the first substrate, and second semiconductor chips on the first substrate adjacent sides of the first semiconductor chip and wire-bonded to the first substrate, Each of the second semiconductor chips may extend adjacent one of the sides of the first semiconductor chip, the second semiconductor chips may be spaced apart from each other, and the second semiconductor chips may be electrically connected to the first substrate through bonding wires connected to the substrate pads.

A semiconductor package according to some embodiments of the inventive concept may include a first substrate, an external connection terminal on a lower surface of the first substrate, a first semiconductor chip on the first substrate through chip connection terminals, second semiconductor chips between sides of the first substrate and sides of the first semiconductor chip, a lower surface of the second semiconductor chip being in contact with an upper surface of the first substrate, bonding wires connecting the second semiconductor chips to the first substrate, a molding layer on the first semiconductor chip and the second semiconductor chip on the first substrate, a second substrate on the molding layer, and a substrate connection terminal connecting the first substrate and the second substrate, and the second semiconductor chips may be positioned symmetrically with respect to the first semiconductor chip.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 9 to 12 are cross-sectional views illustrating a method of manufacturing a semiconductor package according to embodiments of the inventive concept.

DETAILED DESCRIPTION

Hereinafter, a semiconductor package according to the inventive concept will be described with reference to the drawings.

Figure 1:
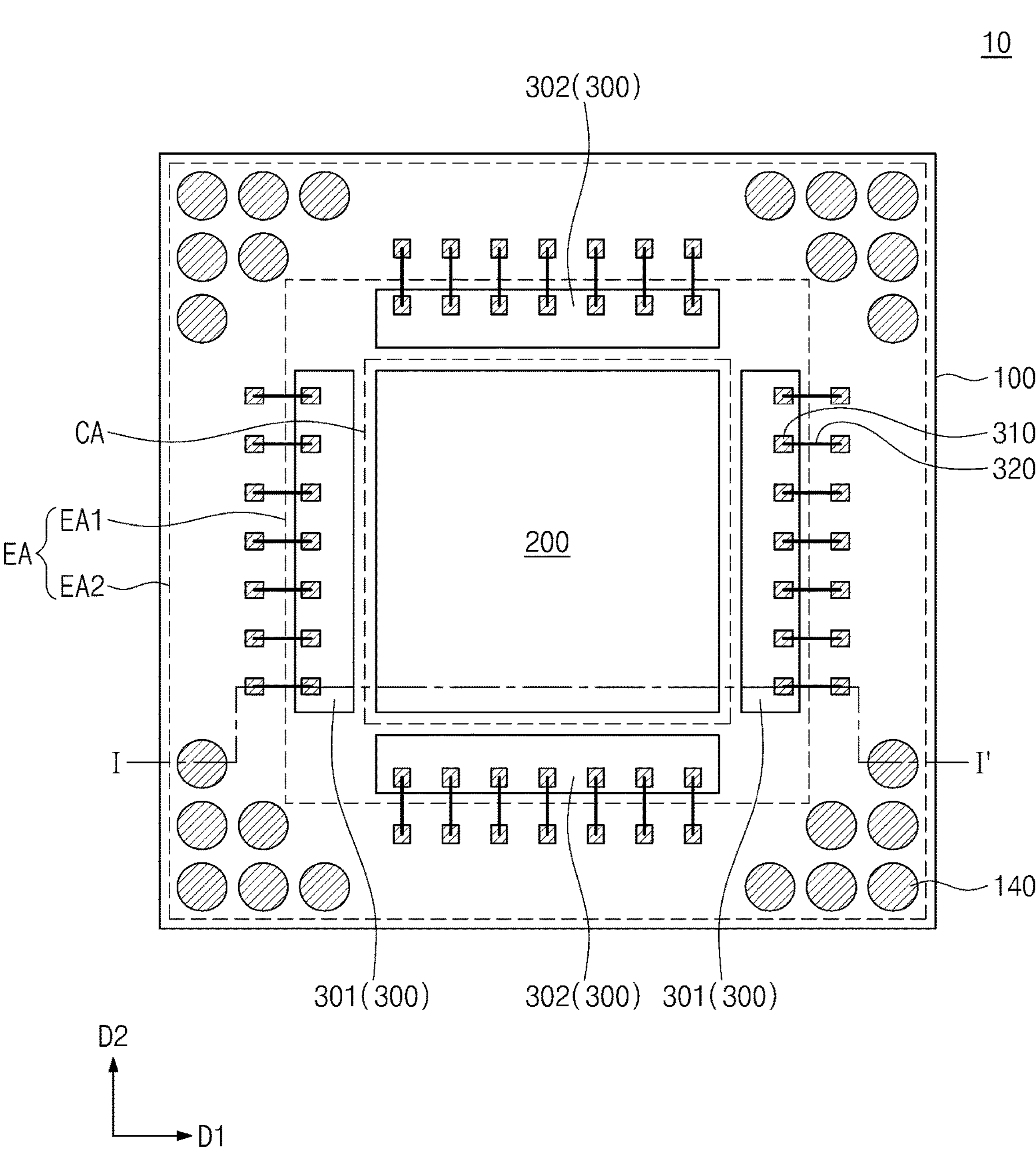
FIG. 1 is a plan view of a semiconductor package according to embodiments of the inventive concept.
Figure 2:
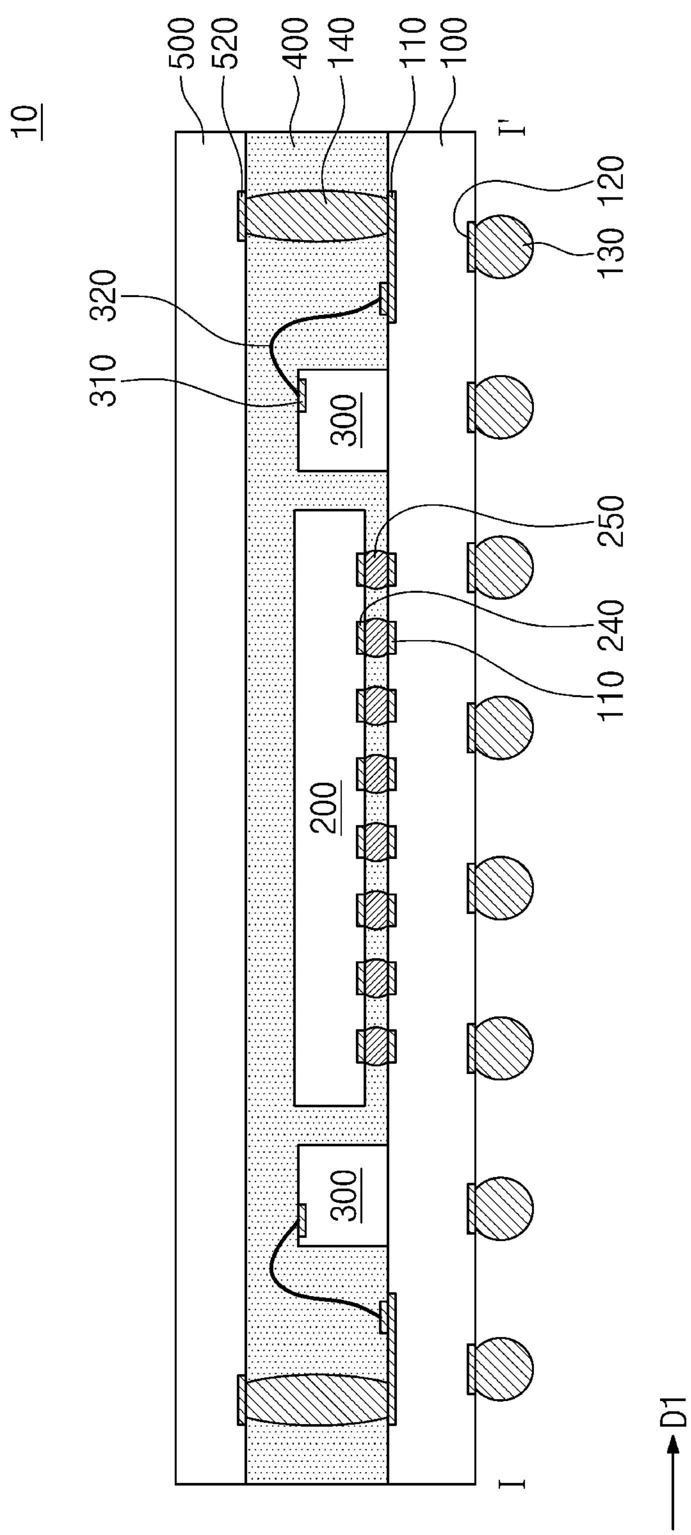
FIG. 2 is a cross-sectional view taken along line I-I' of FIG. 1.

FIG. 1 is a plan view of a semiconductor package according to embodiments of the inventive concept. FIG. 2 is a cross-sectional view of a semiconductor package according to embodiments of the inventive concept.

Referring to FIGS. 1 and 2, a semiconductor package 10 may include a first substrate 100, a first semiconductor chip 200, second semiconductor chips 300, a first molding layer 400, and a second substrate 500.

The first substrate 100 may be a printed circuit board (PCB) having a signal pattern. Alternatively, the first substrate 100 may be a redistribution substrate in which an insulating layer and a wiring layer are alternately stacked. The first substrate 100 may have a central area CA and an outer area EA when viewed in a plan view. When viewed from a plan view, the central area CA may be at a center of the first substrate 100, and the outer area EA may be on or surround the central area CA. The central area CA may be an area where the first semiconductor chip 200 is mounted on the first substrate 100. The outer area EA may be a remaining area on the first substrate 100 on which the first semiconductor chip 200 is not mounted. The outer area EA may include a first outer area EA1 surrounding the central area CA and a second outer area EA2 surrounding the first outer area EA1. In other words, the first outer area EA1 may be between the central area CA and the second outer area EA2. In the present specification, a first direction D1 and a second direction D2 may be directions parallel to an upper surface of the first substrate 100, and the first direction D1 and the second direction D2 may be perpendicular to each other.

The first substrate 100 may have first upper substrate pads 110 and first lower substrate pads 120. The first upper substrate pads 110 may be on the upper surface of the first substrate 100. The first upper substrate pads 110 may be exposed on the upper surface of the first substrate 100. Some of the first upper substrate pads 110 may be in the central area CA of the first substrate 100, and the remaining the first upper substrate pads 110 may be in the second outer area EA2. The first semiconductor chip 200 may be mounted on the first upper substrate pads 110 positioned on the central area CA. The second semiconductor chips 300 may be mounted on the first upper substrate pads 110 positioned on the second outer area EA2. The first lower substrate pads 120 may be on a lower surface of the first substrate 100. The first lower substrate pads 120 may be exposed on the lower surface of the first substrate 100. The first upper substrate pads 110 and the first lower substrate pads 120 may be electrically connected through wirings provided in the first substrate 100. 'Electrical connection/coupling' herein includes direct connection/coupling or indirect connection/coupling through another conductive component. The first upper substrate pads 110 and the first lower substrate pads 120 may include metal such as copper (Cu), aluminum (Au), and/or nickel (Ni).

External connection terminals 130 may be on the lower surface of the first substrate 100. The external connection terminals 130 may be spaced apart from each other. In detail, the external connection terminals 130 may be on the first lower substrate pads 120 provided on the lower surface of the first substrate 100. The external connection terminals 130 may be connected to the first lower substrate pads 120. The external connection terminals 130 may include solder balls or solder bumps. The external connection terminals 130 may be one of tin (Sn), silver (Ag), copper (Cu), nickel (Ni), bismuth (Bi), indium (In), antimony (Sb), cerium (Ce), or alloys thereof. Depending on the type of the external connection terminals 130, the semiconductor package 10 may be a ball grid array (BGA) form, a fine ball-grid array (FBGA) form, or a land grid array (LGA) form.

The first semiconductor chip 200 may be provided on the first substrate 100. The first semiconductor chip 200 may be on the central area CA of the first substrate 100. The first semiconductor chip 200 may be, for example, a logic chip or a buffer chip. The logic chip may include an ASIC chip or an application processor (AP) chip. Alternatively, the logic chip may include a central processing unit (CPU) or a graphics processing unit (GPU). The ASIC chip may include an application specific integrated circuit (ASIC). Alternatively, the first semiconductor chip 200 may be a memory chip.

The first semiconductor chip 200 may have first chip pads 240 provided on a lower surface of the first semiconductor chip 200. The first chip pads 240 may be electrically connected to an integrated circuit formed in the first semiconductor chip 200. The first chip pads 240 may be exposed on the lower surface of the first semiconductor chip 200. The first chip pads 240 may include a conductive material. The first chip pads 240 may include, for example, copper (Cu).

The first semiconductor chip 200 may be mounted on the first substrate 100. For example, the first semiconductor chip 200 may be flip-chip bonded to the first substrate 100. In detail, the first semiconductor chip 200 may be on the first substrate 100 in a face down form. First chip connection terminals 250 may be provided between the first semiconductor chip 200 and the first substrate 100. The first chip connection terminals 250 may be on the central area CA between the first chip pads 240 of the first semiconductor chip 200 and the first upper substrate pads 110 of the first substrate 100. The first chip connection terminals 250 may be connected to the first chip pads 240 and the first upper substrate pads 110. Accordingly, the first semiconductor chip 200 may be electrically connected to the first substrate 100 through the first chip connection terminals 250. The first chip connection terminals 250 may include a conductive material. The first chip connection terminals 250 may include solder balls or solder bumps. The first chip connection terminals 250 may include, for example, tin (Sn), bismuth (Bi), lead (Pb), silver (Ag), or an alloy thereof.

The second semiconductor chips 300 may be provided on the first substrate 100. The second semiconductor chips 300 may include, for example, memory chips. When viewed from a plan view, the second semiconductor chips 300 may be in the first outer area EA1 of the first substrate 100. Each of the second semiconductor chips 300 may be between sides of the first semiconductor chip 200 and sides of the first substrate 100. The second semiconductor chips 300 may be adjacent sides of the first semiconductor chip 200. For example, the second semiconductor chips 300 may include first sub-semiconductor chips 301 positioned on both sides of the first semiconductor chip 200 in the first direction D1 and second sub-semiconductor chips 302 positioned on both sides of the first semiconductor chip 200 in the second direction D2. Each of the second semiconductor chips 300 may extend along an adjacent one of the sides of the first semiconductor chip 200. In this case, lengths of the second semiconductor chips 300 may be the same as or similar to widths of the adjacent sides of the first semiconductor chips 200. For example, a length of the first sub-semiconductor chips 301 in the second direction D2 may be the same as or similar to a width of the first semiconductor chip 200 in the second direction D2. A length of the second sub-semiconductor chips 302 in the first direction D1 may be the same as or similar to a width of the first semiconductor chip 200 in the first direction D1. However, the inventive concept is not limited thereto, and the lengths of the second semiconductor chips 300 may be greater than the widths of the adjacent sides of the first semiconductor chips 200. Each of the second semiconductor chips 300 may face one of the sides of the first semiconductor chip 200. For example, the second semiconductor chips 300 may be adjacent four sides of the first semiconductor chip 200. Each of the second semiconductor chips 300 may be spaced apart from the sides of the first semiconductor chip 200. The second semiconductor chips 300 may be spaced apart from each other.

The second semiconductor chips 300 may be positioned symmetrically with respect to the first semiconductor chip 200. For example, the first sub-semiconductor chips 301 may be positioned axisymmetrically with respect to the first semiconductor chip 200. In detail, the first sub-semiconductor chips 301 may be symmetrical to each other in the first direction D1 with the first semiconductor chip 200 interposed therebetween. The second sub-semiconductor chips 302 may be symmetrical to each other in the second direction D2 with the first semiconductor chip 200 interposed therebetween. Here, that the second semiconductor chips 300 are symmetrical means that positions of the second semiconductor chips 300 on the first substrate 100 are symmetrical and planar shapes of the second semiconductor chips 300 are symmetrical.

The lower surfaces of the second semiconductor chips 300 may be in contact with the upper surface of the first substrate 100. The first sub-semiconductor chips 301 may have an elongated shape (e.g., a bar shape) extending in the second direction D2. The second sub-semiconductor chips 302 may have an elongated shape (e.g., a bar shape) extending in the first direction D1. The second semiconductor chips 300 may have a rectangular shape when viewed in a plan view, but the planar shape of the second semiconductor chips 300 according to embodiments is not limited thereto. As illustrated, the planar area of each of the second semiconductor chips 300 may be substantially the same as each other. According to other embodiments, the planar areas of the second semiconductor chips 300 may be different from each other.

A width of each of the second semiconductor chips 300 may be smaller than that of the first semiconductor chip 200. In detail in the first direction D1, the widths of the first sub-semiconductor chips 301 may be smaller than the widths of the first semiconductor chips 200. In the second direction D2, the widths of the second sub-semiconductor chips 302 may be smaller than the widths of the first semiconductor chips 200.

The second semiconductor chips 300 may have second chip pads 310 provided on upper surfaces. The second chip pads 310 may be electrically connected to integrated circuits formed in the second semiconductor chips 300. The second chip pads 310 may be exposed on the upper surfaces of the second semiconductor chips 300. The second chip pads 310 may include a conductive material. The second chip pads 310 may include, for example, copper (Cu).

The second semiconductor chips 300 may be wire-bonded to the first substrate 100. In detail, the second semiconductor chips may be on the first substrate 100 in a face up form. Bonding wires 320 may be provided on the first substrate 100. The second chip pads 310 and the first upper substrate pads 110 positioned on the second outer area EA2 may be connected through the bonding wires 320. In this case, each of the first upper substrate pads 110 positioned on the second outer area EA2 may be positioned in a direction from the second semiconductor chips 300 toward the side surface of the first substrate 100. That is, the bonding wires 320 may be connected to the second chip pads 310 of the second semiconductor chips 300 and may extend toward the side surface of the first substrate 100 to be connected to the first upper substrate pads 110 on the second outer area EA2. As shown in FIG. 2, the bonding wires 320 may be connected to the first upper substrate pads 110 through bonding pads, but in another embodiment, the bonding wires 320 may be directly connected to the first upper substrate pads 110. The second semiconductor chips 300 may be electrically connected to the first semiconductor chip 200 through the bonding wires 320 and the first substrate 100. The bonding wires 320 connected to the second chip pads 310 of one second semiconductor chip 300 may not directly contact the bonding wires 320 connected to second chip pads 310 of another second semiconductor chip 300. That is, each of the second semiconductor chips 300 may be independently connected to the first substrate 100. Accordingly, even when one of the second semiconductor chips 300 in the semiconductor package 10 is damaged, driving of the other second semiconductor chips 300 may not be affected.

Substrate connection terminals 140 may be provided on the first substrate 100. When viewed in a plan view, the substrate connection terminals 140 may be in the second outer area EA2 of the first substrate 100. As shown, the substrate connection terminals 140 are adjacent to corners of the first substrate 100 in a plan view, but the inventive concept is not limited thereto. The substrate connection terminals 140 may be surround the first outer area EA1. The substrate connection terminals 140 may be spaced apart from the first semiconductor chip 200 and the second semiconductor chips 300. The substrate connection terminals 140 may be on the first upper substrate pads 110 positioned on the second outer area EA2. The substrate connection terminals 140 may be electrically connected to the second semiconductor chips 300 through the first upper substrate pads 110 and the bonding wires 320. The substrate connection terminals 140 may connect the first substrate 100 and the second substrate 500 to be described later. Upper surfaces of the substrate connection terminals 140 may be positioned at a higher level from the first substrate 100 than upper surfaces of the first semiconductor chip 200 and the second semiconductor chips 300. In detail, the upper surfaces of the substrate connection terminals 140 may be positioned at the same level as or higher than uppermost ends of the bonding wires 320 from the first substrate 100. The substrate connection terminals 140 may include solder balls or solder bumps. The substrate connection terminals 140 may include, for example, tin (Sn), bismuth (Bi), lead (Pb), silver (Ag), or an alloy thereof.

The first molding layer 400 may be provided on the first substrate 100. The first molding layer 400 may be on (e.g., to surround) the first semiconductor chip 200, the second semiconductor chips 300, the bonding wires 320, and the substrate connection terminals 140 on the first substrate 100. The first molding layer 400 may be in or fill a space between the first semiconductor chip 200 and the first substrate 100 and may be on sidewalls of or surround the first chip connection terminals 250. Alternatively, a space between the first semiconductor chip 200 and the first substrate 100 may include or be filled with an underfill material. The first molding layer 400 may expose upper surfaces of the substrate connection terminals 140. The first molding layer 400 may include an insulating polymer such as an epoxy-based molding compound (EMC).

The second substrate 500 may be provided on the first molding layer 400. The second substrate 500 may be a printed circuit board (PCB) having a signal pattern. Alternatively, the first substrate 100 may be a redistribution substrate in which insulating layers and wiring patterns are alternately stacked. Second lower substrate pads 520 may be on the lower surface of the second substrate 500. The second lower substrate pads 520 may be exposed on a lower surface of the second substrate 500. The second lower substrate pads 520 may be electrically connected to wirings provided in the second substrate 500. The second lower substrate pads 520 may be electrically connected to the substrate connection terminals 140. Although not shown, the second substrate 500 may further include second upper substrate pads for mounting other electronic devices on the second substrate 500 as needed. The second lower substrate pads 520 may include a metal material such as copper (Cu), aluminum (Au), and/or nickel (Ni).

The semiconductor package 10 according to embodiments of the inventive concept may include the second semiconductor chips 300 extending along the sides of the first semiconductor chip 200 and thus introduction of foreign substances between the first semiconductor chip 200 and the first substrate 100 may be prevented. This may prevent an electrical short between the first chip connection terminals 250 due to the foreign substances. In addition, warpage of the first semiconductor chip 200 and the semiconductor package 10 may be controlled through the second semiconductor chips 300 positioned symmetrically with respect to the first semiconductor chip 200. Thus, the semiconductor package 10 may have improved structural stability.

Figure 3:
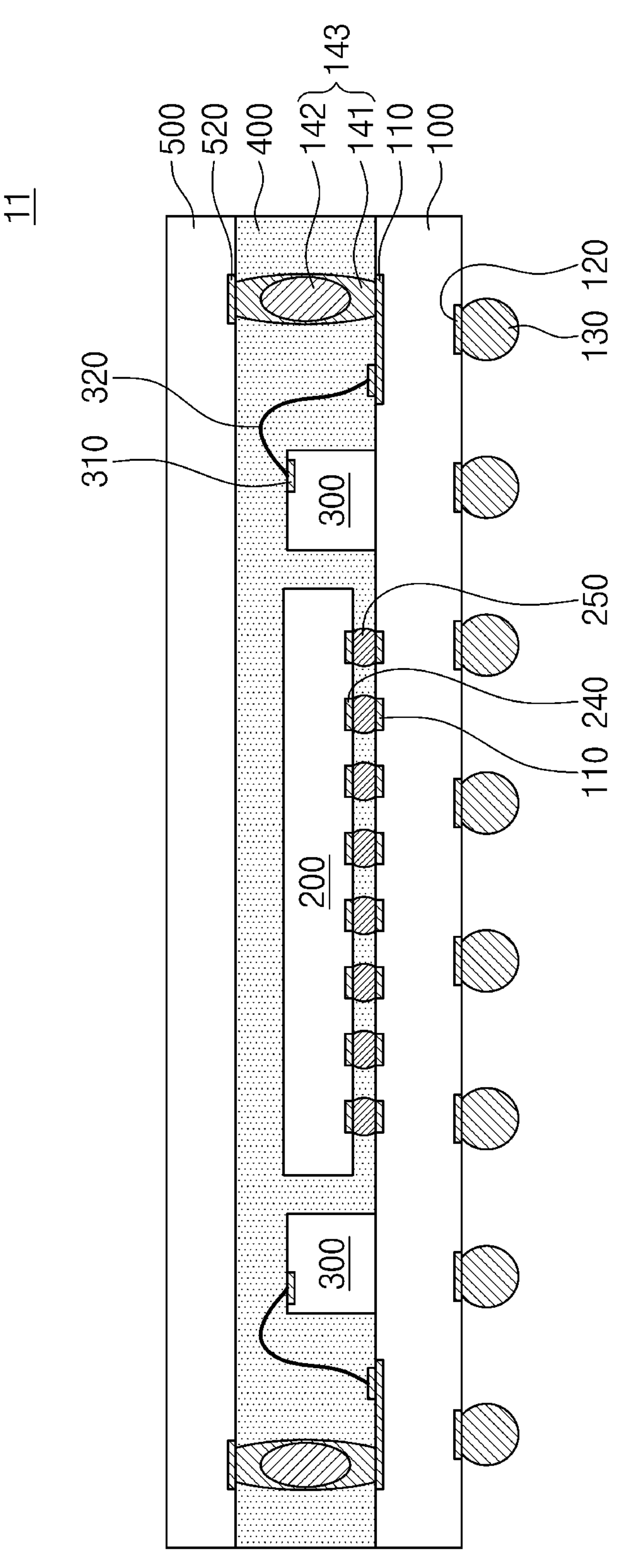
FIG. 3 is a cross-sectional view of a semiconductor package according to embodiments of the inventive concept.

FIG. 3 is a cross-sectional view of a semiconductor package according to embodiments of the inventive concept. Hereinafter, for convenience of explanation, like reference numbers refer to like elements, and duplicate contents with those described above will be omitted.

Referring to FIG. 3, unlike the embodiments of FIGS. 1 and 2, each of substrate connection terminals 143 may include a core 142 and a peripheral portion 141 on side surfaces of or surrounding the core 142. The peripheral portion 141 may be a metal layer plated on a surface of the core 142. That is, the substrate connection terminals 143 may be solder balls having a complex structure. The core 142 may include a material with a higher melting point than that of a material constituting the peripheral portion 141. For example, the peripheral portion 141 may include tin (Sn), bismuth (Bi), lead (Pb), silver (Ag), or an alloy thereof. The core 142 may include copper (Cu). The substrate connection terminals 143 having a composite structure may be stable at high temperatures and have high mechanical strength, and thus structural stability of the semiconductor package 11 may be improved. Unlike those shown in FIGS. 1 to 3, the substrate connection terminals 143 may be through vias connecting the first substrate 100 and the second substrate 500, or a connecting substrate including a conductive pattern and an insulating pattern.

Figure 4:
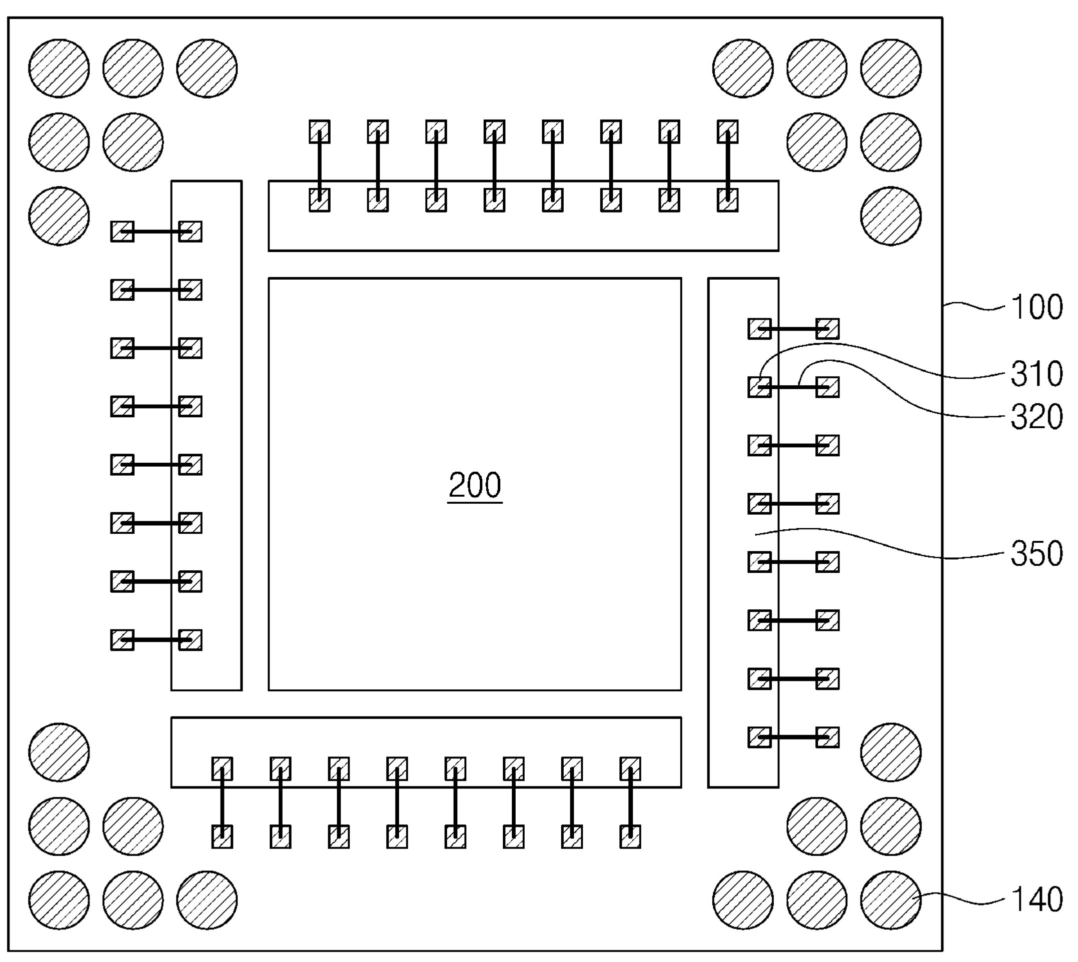
FIGS. 4 to 7 are plan views of semiconductor packages according to embodiments of the inventive concept.
Figure 4:
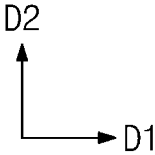

FIG. 4 is a plan view of a semiconductor package according to embodiments of the inventive concept. Hereinafter, like reference numbers refer to like elements, and duplicate contents with those described above will be omitted.

Referring to FIG. 4, a semiconductor package 12 may include a first semiconductor chip 200 on a first substrate 100 and second semiconductor chips 350 adjacent sides of the first semiconductor chip 200. The second chips 350 may be positioned rotationally symmetrically with respect to a center of the first semiconductor chip 200. In detail, one second semiconductor chip 350 may be obtained by rotating another adjacent second semiconductor chip 350 by 90° with respect to the center of the first semiconductor chip 200. The second semiconductor chips 350 may extend along the sides of the first semiconductor chip 200. In detail, each of the second semiconductor chips 350 may have a rectangular shape when viewed in a plan view, and each of the second semiconductor chips 350 may include a first side surface facing the first semiconductor chip 200 and a second side surface perpendicular to the first side surface and narrower than the first side surface. In this case, one second semiconductor chip 350 may extend along an adjacent one of the sides of the first semiconductor chip 200 and a second side surface of another adjacent second semiconductor chip 350. A first side surface of one second semiconductor chip 350 may face a second side surface of another adjacent second semiconductor chip 350. Other configurations may be substantially the same as those of the semiconductor package 10.

Figure 5:
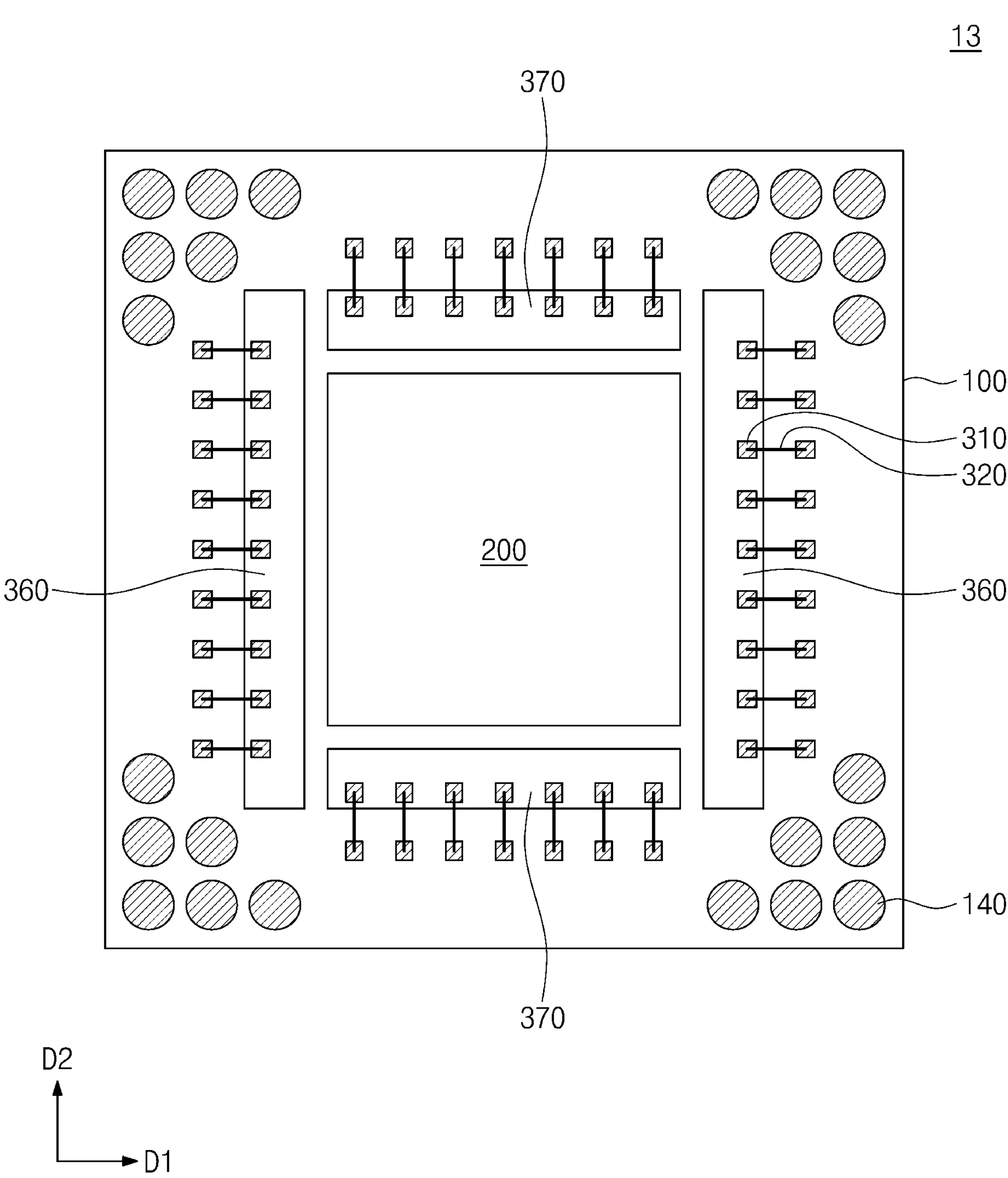

FIG. 5 is a plan view of a semiconductor package according to embodiments of the inventive concept. Hereinafter, like reference numbers refer to like elements, and duplicate contents with those described above will be omitted.

Referring to FIG. 5, a semiconductor package 13 may include a first semiconductor chip 200 on a first substrate 100 and second semiconductor chips 360 and 370 adjacent sides of the first semiconductor chip 200. The second semiconductor chips 360 and 370 may include first sub-semiconductor chips 360 and second sub-semiconductor chips 370.

The first sub-semiconductor chips 360 may have an elongated shape (e.g., a bar shape) extending in a second direction D2. The first sub-semiconductor chips 360 may be extend in a first direction D1 with the first semiconductor chip 200 interposed therebetween. The second sub-semiconductor chips 370 may have an elongated shape (e.g., a bar shape) extending in the first direction D1. The second sub-semiconductor chips 370 may be extend in the second direction D2 with the first semiconductor chip 200 interposed therebetween. The first sub-semiconductor chips 360 and the second sub-semiconductor chips 370 may extend along adjacent one of the sides of the first semiconductor chip 200, and the first sub-semiconductor chips 360 may extend to side surfaces of the second sub-semiconductor chips 370 in the second direction D2. Accordingly, the second sub-semiconductor chips 370 may be between the first sub-semiconductor chips 360. In this case, a length of the first sub-semiconductor chips 360 in the second direction D2 may be longer than a length of the second sub-semiconductor chips 370 in the first direction D1. The first sub-semiconductor chips 360 may be axisymmetrically positioned with respect to the first semiconductor chip 200. The positions of the second sub-semiconductor chips 370 may have an axisymmetric structure with respect to the first semiconductor chip 200. Other configurations may be substantially the same as those of the semiconductor package 10.

Figure 6:
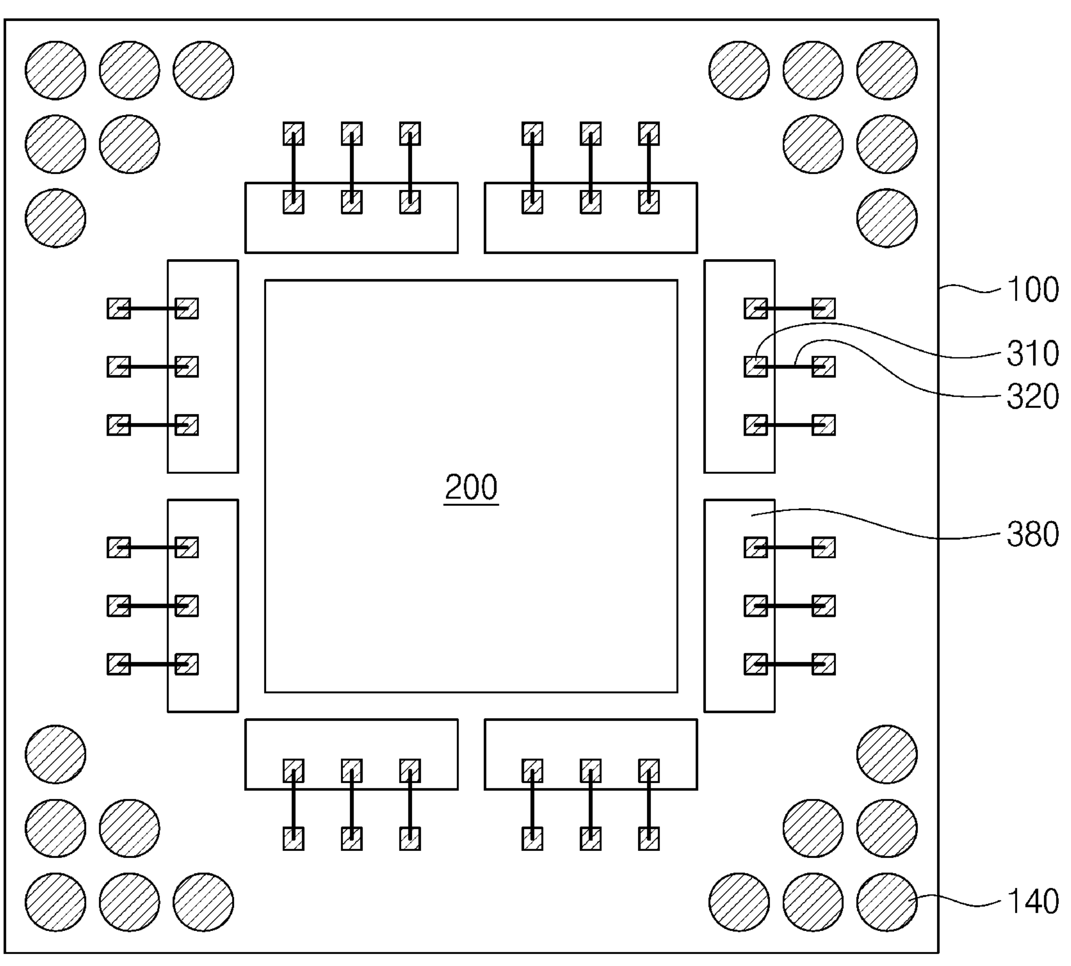
Figure 6:
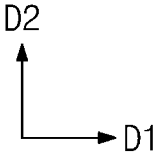

FIG. 6 is a plan view of a semiconductor package according to embodiments of the inventive concept. Hereinafter, like reference numbers refer to like elements, and duplicate contents with those described above will be omitted.

Referring to FIG. 6, a semiconductor package 14 may include a first semiconductor chip 200 on a first substrate 100 and second semiconductor chips 380 adjacent sides of the first semiconductor chip 200. Unlike the embodiment of FIG. 1, at least two second semiconductor chips 380 may face one side of the first semiconductor chip 200. The second semiconductor chips 380 facing the same side surface of the first semiconductor chip 200 may be spaced apart from each other in a direction parallel to the side surface of the first semiconductor chip 200. For example, the second semiconductor chips 380 positioned in a first direction D1 of the first semiconductor chip 200 may be spaced apart from each other in the second direction D2, and the second semiconductor chips 380 positioned in the second direction D2 of the first semiconductor chip 200 may be spaced apart from each other in the first direction D1. As shown, eight second semiconductor chips 380 are adjacent sides of the first semiconductor chip 200, but the inventive concept is not limited thereto, and the number of second semiconductor chips 380 may be various as needed. Other configurations may be substantially the same as those of the semiconductor package 10.

Figure 7:
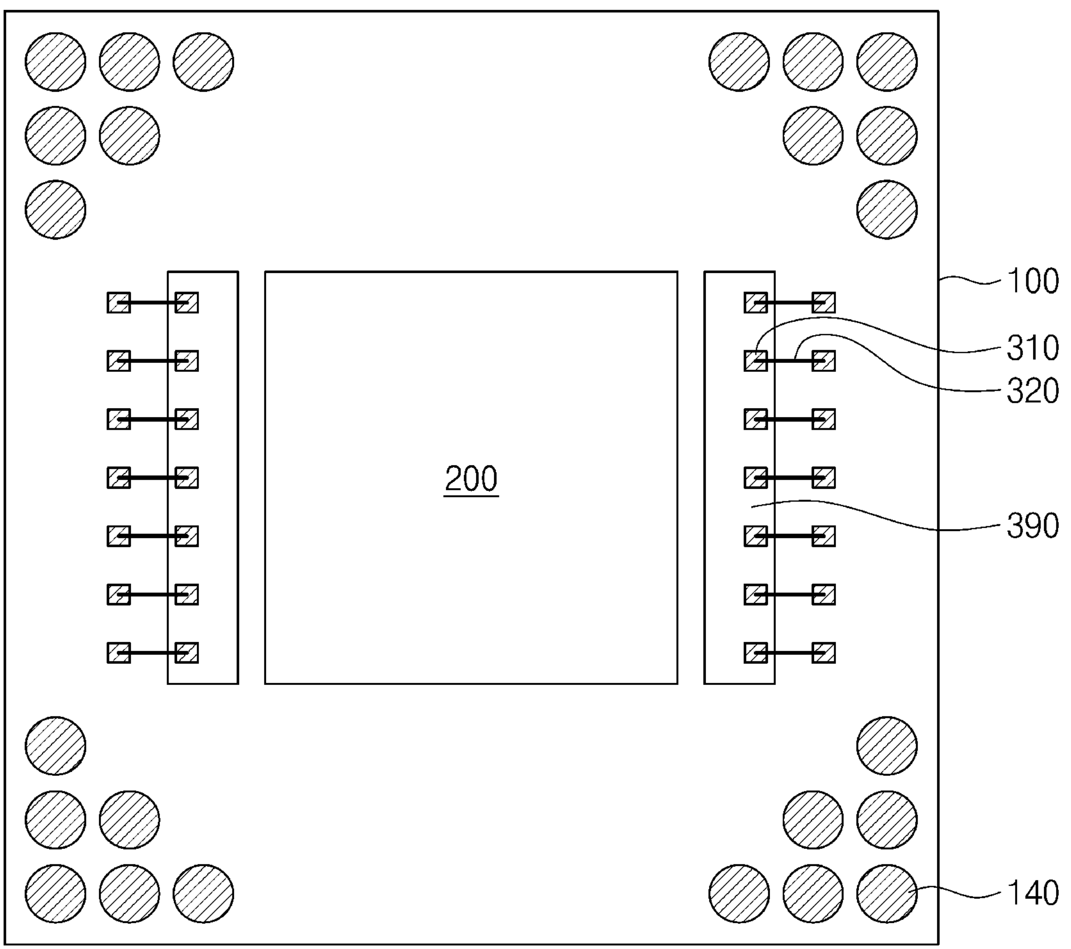
Figure 7:
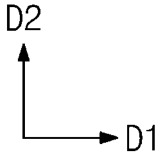

FIG. 7 is a plan view of a semiconductor package according to embodiments of the inventive concept. Hereinafter, like reference numbers refer to like elements, and duplicate contents with those described above will be omitted.

Referring to FIG. 7, a semiconductor package 15 may include a first semiconductor chip 200 on a first substrate 100 and second semiconductor chips 390 adjacent sides of the first semiconductor chip 200. Unlike the embodiment of FIG. 1, the second semiconductor chips 390 may face each other on two opposite sides of the first semiconductor chip 200. The second semiconductor chips 390 may extend in the first direction D1 with the first semiconductor chip 200 interposed therebetween. The second semiconductor chips 390 may have an elongated shape (e.g., a bar shape) extending in the second direction D2. When viewed in a plan view, the second semiconductor chips 390 may be positioned axisymmetrically with respect to a center of the first semiconductor chip 200. Other configurations may be substantially the same as those of the semiconductor package 10.

Figure 8:
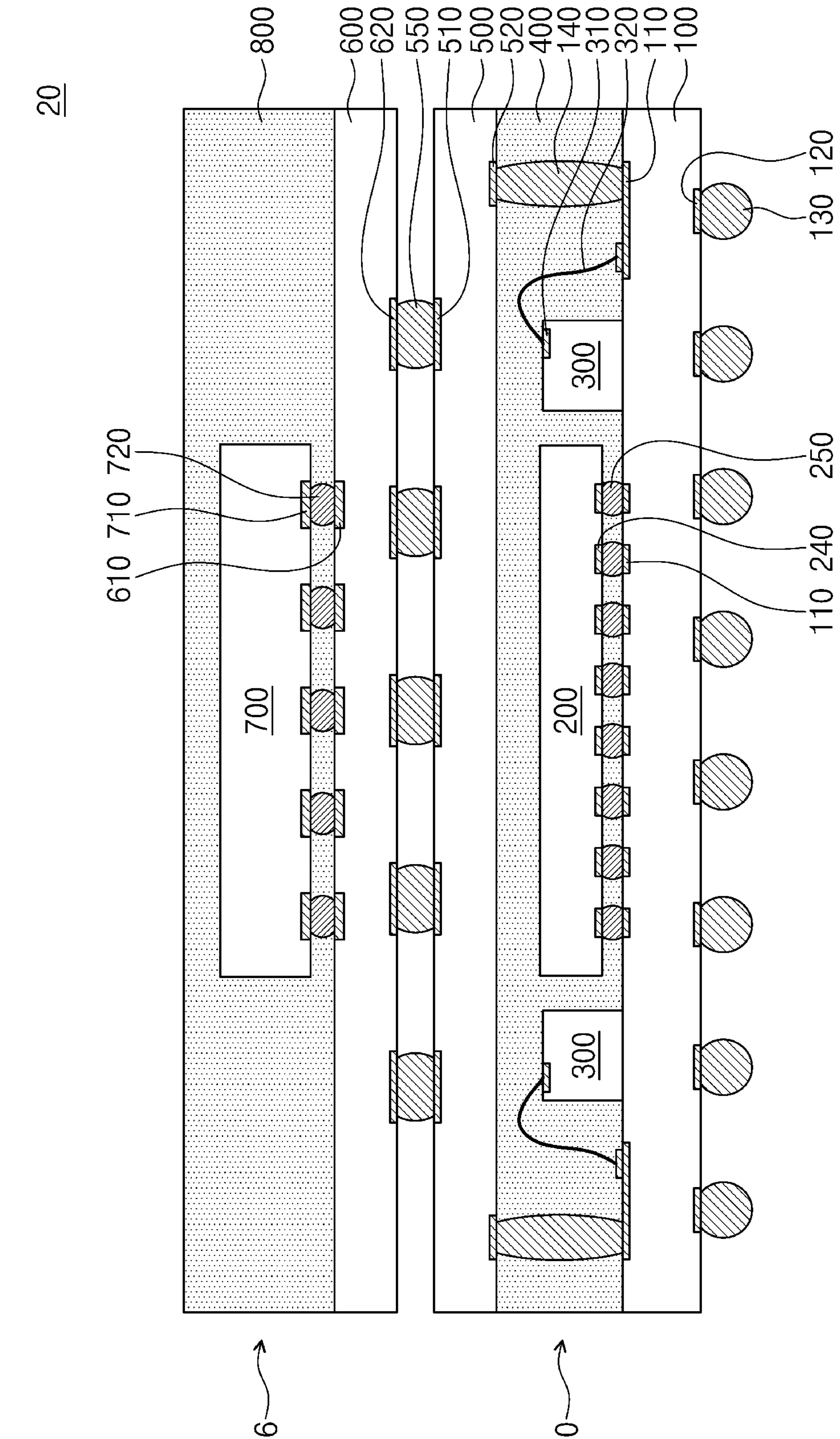
FIG. 8 is a cross-sectional view of a semiconductor package according to embodiments of the inventive concept.

FIG. 8 is a cross-sectional view of a semiconductor package according to embodiments of the inventive concept.

Hereinafter, like reference numbers refer to like elements, and duplicate contents with those described above will be omitted.

Referring to FIG. 8, a semiconductor package 20 may include a first semiconductor package 10 and a second semiconductor package 16. The first semiconductor package 10 may correspond to the semiconductor package 10 described with reference to FIG. 1. In another embodiment, the first semiconductor package may correspond to one of the semiconductor packages described with reference to FIGS. 3 to 7.

The second substrate 500 may further include second upper substrate pads 510 on an upper surface thereof. The second upper substrate pads 510 may be exposed on the upper surface of the second substrate 500. The second upper substrate pads 510 and the second lower substrate pads 520 may be electrically connected through wirings in the second substrate 500.

The second semiconductor package 16 may be provided on the first semiconductor package 10. The second semiconductor package 16 may include a third substrate 600, a third semiconductor chip 700, second chip connection terminals 720, and a second molding layer 800.

The third substrate 600 may be provided on the second substrate 500. The third substrate 600 may be a printed circuit board. Alternatively, the third substrate 600 may be a redistribution substrate including a mutually stacked wiring layer and an insulating layer. Third upper substrate pads 610 may be on an upper surface of the third substrate 600. The third upper substrate pads 610 may be exposed on the upper surface of the third substrate 600. Third lower substrate pads 620 may be on a lower surface of the third substrate 600. The third lower substrate pads 620 may be exposed on the lower surface of the third substrate 600. The third upper substrate pads 610 and the third lower substrate pads 620 may be electrically connected through wirings in the third substrate 600.

Package connection terminals 550 may be provided between the second substrate 500 and the third substrate 600. The package connection terminals 550 may connect the second upper substrate pads 510 and the third lower substrate pads 620. The first semiconductor package 10 and the second semiconductor package 16 may be electrically connected by the package connection terminals 550.

The third semiconductor chip 700 may be provided on the third substrate 600. The third semiconductor chip 700 may have third chip pads 710 provided on a lower surface of the third semiconductor chip 700. The third chip pads 710 may be electrically connected to an integrated circuit formed in the third semiconductor chip 700. The third chip pads 710 may be exposed on the lower surface of the third semiconductor chip 700. The third chip pads 710 may include a conductive material. The third chip pads 710 may include, for example, copper (Cu).

The third semiconductor chip 700 may be mounted on the third substrate 600. For example, the third semiconductor chip 700 may be flip-chip bonded to the third substrate 600. In detail, the second chip connection terminals 720 may be provided between the third semiconductor chip 700 and the third substrate 600. The second chip connection terminals 720 may be between the third chip pads 710 of the third semiconductor chip 700 and the third upper substrate pads 610 of the third substrate 600. The second chip connection terminals 720 may be connected to the third chip pads 710 and the third upper substrate pads 610. Accordingly, the third semiconductor chip 700 may be electrically connected to the first semiconductor package 10 through the third substrate 600. The second chip connection terminals 720 may include a conductive material. The second chip connection terminals 720 may include, for example, solder balls or solder bumps.

The second molding layer 800 may be provided on the third substrate 600. The second molding layer 800 may cover the third semiconductor chip 700 on the third substrate 600. The second molding layer 800 may surround the second chip connection terminals 720 between the third substrate 600 and the third semiconductor chip 700. Alternatively, an underfill may be provided between the third substrate 600 and the third semiconductor chip 700. The second molding layer 800 may include an insulating polymer such as an epoxy-based molding compound (EMC).

FIGS. 9 to 12 are cross-sectional views illustrating a method of manufacturing a semiconductor package according to embodiments of the inventive concept. Hereinafter, like reference numerals refer to like elements.

Figures 9, 10:
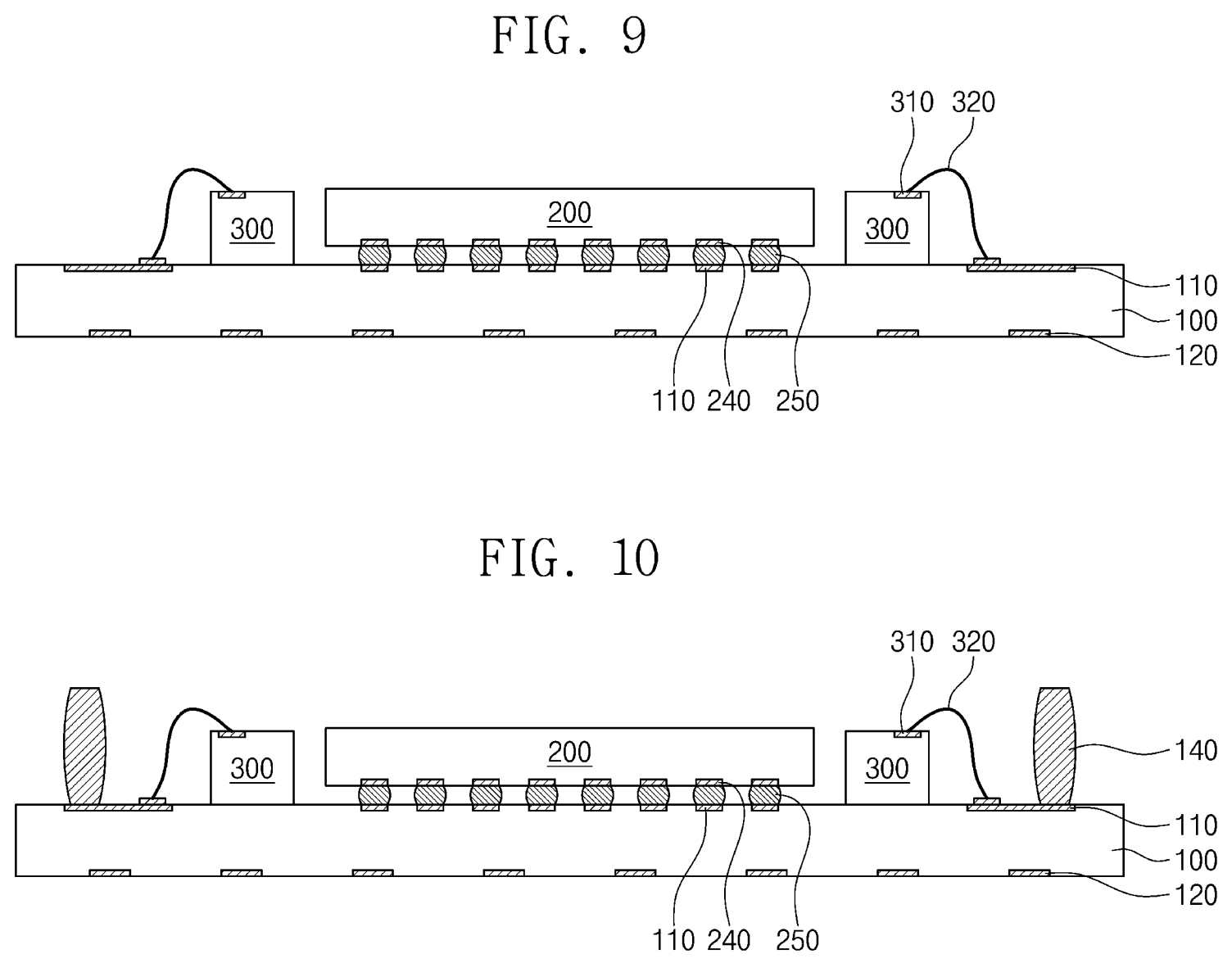

Referring to FIG. 9, a first substrate 100 may be provided. The first substrate 100 may correspond to the first substrate 100 described with reference to FIGS. 1 and 2.

A first semiconductor chip 200 may be on the first substrate 100. The first semiconductor chip 200 may correspond to the first semiconductor chip described with reference to FIGS. 1 and 2. For example, the first semiconductor chip 200 may be flip-chip bonded to the first substrate 100. The first semiconductor chip 200 may be mounted on the first substrate 100 through first chip connection terminals 250. For example, first chip connection terminals 250 may be provided on first chip pads 240 of the first semiconductor chip 200. The first semiconductor chip 200 may be on the first substrate 100 in a face-down form. The first semiconductor chip 200 may be on the first substrate 100 such that the first chip connection terminals 250 are aligned with first upper substrate pads 110. Thereafter, a reflow process may be performed on the first chip connection terminals 250 and thus the first chip connection terminals 250 may connect the first chip pads 240 and the first upper substrate pads 110.

Second semiconductor chips 300 may be on the first substrate 100. The second semiconductor chips 300 may correspond to the second semiconductor chips described with reference to FIGS. 1 and 2. The second semiconductor chips 300 may be wire-bonded to the first substrate 100. In detail, the second semiconductor chips 300 may be on the first substrate 100 in a face-up form. Bonding wires 320 connecting the second chip pads 310 on the upper surfaces of the second semiconductor chips 300 and the first upper substrate pads 110 of the first substrate 100 may be formed. The bonding wires 320 connected to one of the second semiconductor chips 300 may not be in direct contact with the bonding wires 320 connected to the other second semiconductor chips 300. The second semiconductor chips 300 may be spaced apart from side surfaces of the first semiconductor chip 200. The second semiconductor chips 300 may surround side surfaces of the first semiconductor chip 200. In detail, similar to FIGS. 1 and 4 to 7 described above, the second semiconductor chips 300 may be adjacent sides of the first semiconductor chip 200.

Although not shown, an underfill may be formed in or fill a space between the first substrate 100 and the first semiconductor chip 200. The underfill may be on sides of (e.g., to surround) the first semiconductor chip 200 between the second semiconductor chips 300. The underfill may be on sides of (e.g., to surround) the first chip connection terminals 250 between the first substrate 100 and the first semiconductor chip 200. In this case, the second semiconductor chips 300 may serve as a dam. The second semiconductor chips 300 may prevent introduction of foreign substances between the first substrate 100 and the first semiconductor chip 200 and between the first chip connection terminals 250.

Referring to FIG. 10, substrate connection terminals 140 may be on the first substrate 100. The substrate connection terminals 140 may be on the first upper substrate pads 110 and may be electrically connected to the second semiconductor chips 300 through the first upper substrate pads 110 and bonding wires 320. In another embodiment, photoresist may be provided on the first substrate 100, and through vias may be formed on the first upper substrate pads 110 using the photoresist.

Figure 11:
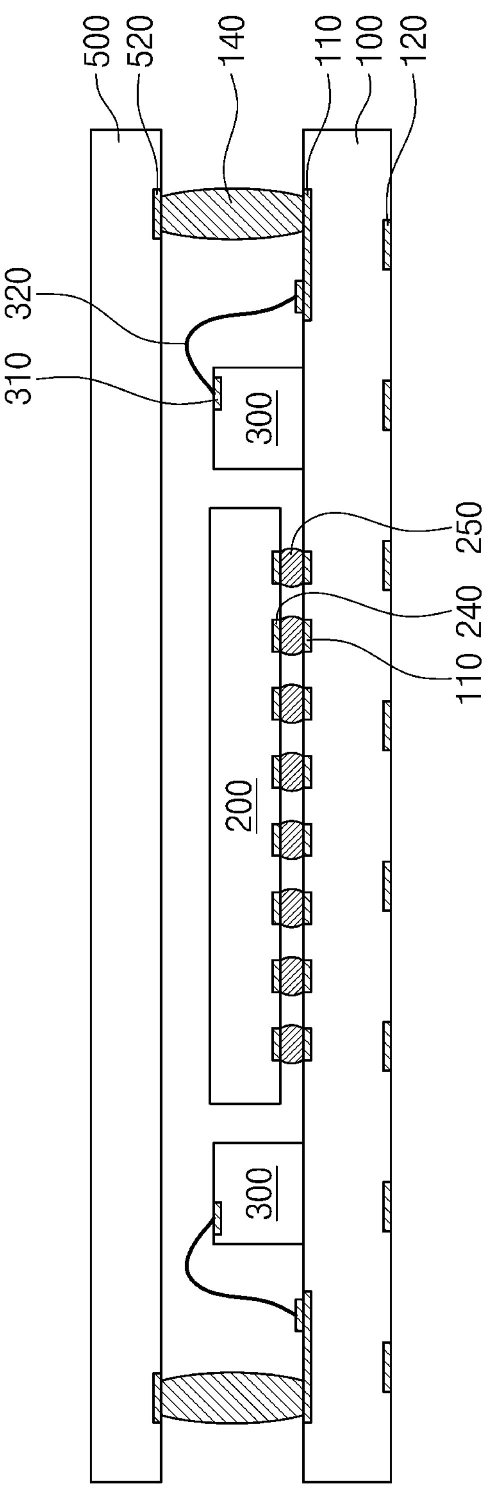

Referring to FIG. 11, a second substrate 500 may be on the first substrate 100. In detail, second lower substrate pads 520 of the second substrate 500 may be placed in contact with upper surfaces of the substrate connection terminals 140, and then a reflow process may be performed to the substrate connection terminals 140, thereby connecting the first substrate 100 and the second substrate 500.

Figure 12:
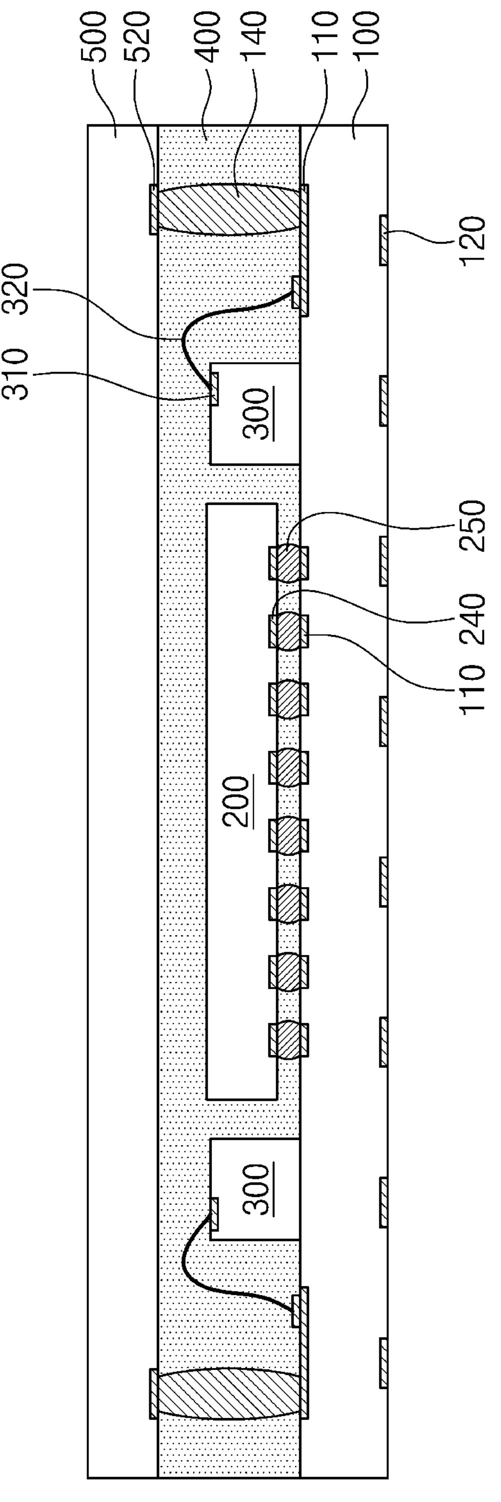

Referring to FIG. 12, a first molding layer 400 may fill a space between the first substrate 100 and the second substrate 500. The first molding layer 400 may cover the first semiconductor chip 200, the second semiconductor chips 300, the bonding wires 320, and the substrate connection terminals 140. When the first molding layer 400 fills the space between the first substrate 100 and the second substrate 500, the second semiconductor chips 300 may serve as a dam. The second semiconductor chips 300 may prevent foreign substances from being introduced between the first semiconductor chip 200 and the first substrate 100, thereby preventing an electrical short between the first chip connection terminals 250.

Referring to FIG. 1, external connection terminals 130 may be on a lower surface of the first substrate 100. In detail, first lower substrate pads 120 may be on the first lower substrate pads 120. Accordingly, the semiconductor package 10 may be manufactured.

The semiconductor package according to embodiments may include the second semiconductor chips on a perimeter of or adjacent the sides of the first semiconductor chip on the substrate. The second semiconductor chips may be positioned symmetrically with respect to the first semiconductor chip to reduce a likelihood of or prevent the first semiconductor chip and the semiconductor package from being bent. Accordingly, the structural stability of the semiconductor package may be improved.

While embodiments are described above, a person skilled in the art may understand that many modifications and variations are made without departing from the spirit and scope of the inventive concept defined in the following claims. Accordingly, the example embodiments of the inventive concept should be considered in all respects as illustrative and not restrictive, with the spirit and scope of the inventive concept being indicated by the appended claims.

What is claimed is:

1. A semiconductor package comprising:

a first substrate;

a first semiconductor chip on the first substrate; and a plurality of second semiconductor chips on the first substrate and positioned along the perimeter of the first semiconductor chip, wherein each of the second semiconductor chips has an elongated shape extending along one of the sides of the first semiconductor chip adjacent thereto, and wherein a width of each of the second semiconductor chips is smaller than a width of the first semiconductor chip.

2. The semiconductor package of claim 1, wherein the second semiconductor chips are spaced apart from each other, and wherein the second semiconductor chips are wire-bonded to the first substrate.

3. The semiconductor package of claim 1, further comprising:

a second substrate on the first semiconductor chip and the second semiconductor chips; and a substrate connection terminal spaced apart from the first semiconductor chip and the second semiconductor chips, and connecting the first substrate and the second substrate.

4. The semiconductor package of claim 3, wherein the substrate connection terminal includes:

a core; and a peripheral portion surrounding the core.

5. The semiconductor package of claim 1, wherein the second semiconductor chips are adjacent four sides of the first semiconductor chip, and wherein each of the second semiconductor chips faces one of the sides of the first semiconductor chip.

6. The semiconductor package of claim 1, wherein lower surfaces of the second semiconductor chips are in contact with an upper surface of the first substrate.

7. The semiconductor package of claim 1, wherein the second semiconductor chips are rectangular in a plan view.

8. The semiconductor package of claim 1, wherein the first semiconductor chip includes a logic chip, and wherein the second semiconductor chips include a memory chip.

9. A semiconductor package comprising:

a first substrate including substrate pads on an upper surface thereof;

a first semiconductor chip flip-chip bonded to the first substrate; and a plurality of second semiconductor chips on the first substrate, the plurality of second semiconductor chips positioned along the perimeter of the first semiconductor chip and wire-bonded to the first substrate, wherein each of the second semiconductor chips extends adjacent one of the sides of the first semiconductor chip, wherein the second semiconductor chips are spaced apart from each other, and wherein the second semiconductor chips are electrically connected to the first substrate through bonding wires connected to the substrate pads.

10. The semiconductor package of claim 9, wherein a width of the second semiconductor chips is smaller than a width of the first semiconductor chip.

11. The semiconductor package of claim 9, wherein each of the second semiconductor chips is spaced apart from the sides of the first semiconductor chip.

12. The semiconductor package of claim 9, further comprising:

a second substrate on the first semiconductor chip and the second semiconductor chips; and a substrate connection terminal spaced apart from the first semiconductor chip and the second semiconductor chips, and connecting the first substrate and the second substrate.

13. The semiconductor package of claim 12, wherein the substrate connection terminal is on one of the substrate pads and electrically connected to one of the bonding wires.

14. The semiconductor package of claim 9, wherein the second semiconductor chips are adjacent four sides of the first semiconductor chip, and wherein each of the second semiconductor chips faces one of the four sides of the first semiconductor chip.

15. The semiconductor package of claim 9, wherein a lower surface of the second semiconductor chips contacts an upper surface of the first substrate.

16. The semiconductor package of claim 9, wherein the first semiconductor chip includes a logic chip, and wherein the second semiconductor chips include a memory chip.

17. A semiconductor package comprising:

a first substrate;

an external connection terminal on a lower surface of the first substrate;

a first semiconductor chip on the first substrate through chip connection terminals;

a plurality of second semiconductor chips positioned along the perimeter of the first semiconductor chip and between sides of the first substrate and sides of the first semiconductor chip, a lower surface of the second semiconductor chip contacting an upper surface of the first substrate;

bonding wires connecting the second semiconductor chips to the first substrate;

a molding layer on the first semiconductor chip and the second semiconductor chip on the first substrate;

a second substrate on the molding layer; and a substrate connection terminal connecting the first substrate and the second substrate, wherein the second semiconductor chips are positioned symmetrically with respect to the first semiconductor chip.

18. The semiconductor package of claim 17, wherein a width of each of the second semiconductor chips is smaller than a width of the first semiconductor chip.

19. The semiconductor package of claim 17, wherein the second semiconductor chips are adjacent sides of the first semiconductor chip, and wherein the second semiconductor chips are spaced apart from each other.

20. The semiconductor package of claim 17, wherein the substrate connection terminal includes:

a core; and a peripheral portion surrounding the core.

* * * * *